United States Patent [19]
Park et al.

[11] Patent Number: 4,992,980
[45] Date of Patent: Feb. 12, 1991

[54] NOVEL ARCHITECTURE FOR VIRTUAL GROUND HIGH-DENSITY EPROMS

[75] Inventors: Chin S. Park, Sunnyvale; Gregory E. Atwood, San Jose; Lubin Y. Gee, Cupertino, all of Calif.

[73] Assignee: Intel Corporation, Santa Clara, Calif.

[21] Appl. No.: 390,159

[22] Filed: Aug. 7, 1989

[51] Int. Cl.$^5$ .................... G11C 7/00; G11C 11/40; G11C 11/407
[52] U.S. Cl. .................... 365/104; 365/185; 365/230.04; 365/51; 365/189.04
[58] Field of Search ............ 365/63, 51, 185, 230.04, 365/189.04, 104, 186, 182, 174, 238.5

[56] References Cited

U.S. PATENT DOCUMENTS

| | | | |
|---|---|---|---|
| 3,916,169 | 10/1975 | Cochran et al. | 365/203 |
| 3,934,233 | 1/1976 | Fisher et al. | 365/203 |
| 4,021,781 | 5/1977 | Caudel | 364/200 |
| 4,387,447 | 2/1980 | Klaas et al. | 365/203 |
| 4,410,964 | 10/1983 | Nordling et al. | 365/238.5 X |
| 4,456,977 | 6/1984 | Hayashi | 365/51 |
| 4,460,981 | 7/1984 | Van Buskirk et al. | 365/104 |
| 4,599,709 | 8/1986 | Clemons | 365/238.5 X |
| 4,656,614 | 4/1987 | Suzuki | 365/189.04 |
| 4,697,212 | 9/1987 | Osawa et al. | 360/48 |
| 4,780,424 | 10/1988 | Holler et al. | 437/29 |
| 4,807,188 | 2/1989 | Casagrande | 365/185 X |
| 4,868,790 | 9/1989 | Wilmoth et al. | 365/185 X |
| 4,878,101 | 10/1989 | Hsieh et al. | 365/185 X |

OTHER PUBLICATIONS

"An Asymmetrical Lightly-Doped Source (ALDS) Cell for Virtual Ground High-Density EPROMS", by K. Yoshikawa et al., IEDM, 1988, pp. 432–435.

Primary Examiner—Alyssa H. Bowler
Attorney, Agent, or Firm—Blakely, Sokoloff, Taylor & Zafman

[57] ABSTRACT

A virtual ground electrically programmable read-only memory device in which disturbance to neighboring cells is practically eliminated, is disclosed. In one embodiment the memory device comprises a plurality of memory cells formed in a semiconductor substrate and arranged in rows and columns so as to form an array. During read operations, pairs of adjacent cells are accessed simultaneously by grounding a single column line within the array. The two adjacent column lines—one on each side of the grounded column line—are coupled to separate read paths. Within the array, rows of cells store bits from a plurality of data bytes according to a pattern in which pairs of adjacent cells store different bits from different bytes.

18 Claims, 4 Drawing Sheets

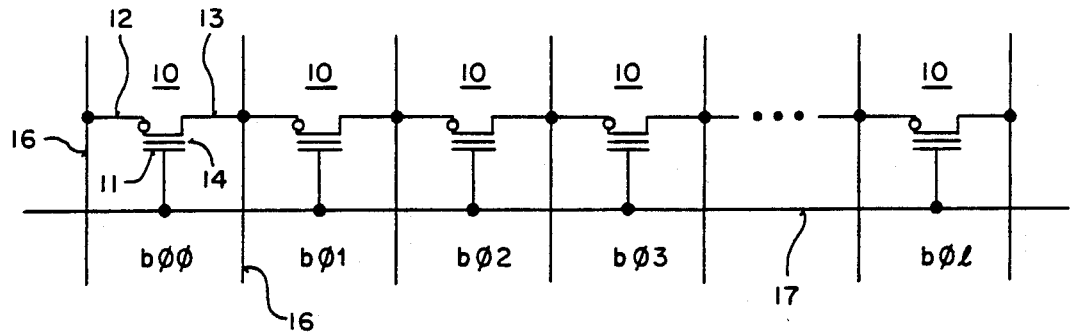
FIG_1 (PRIOR ART)
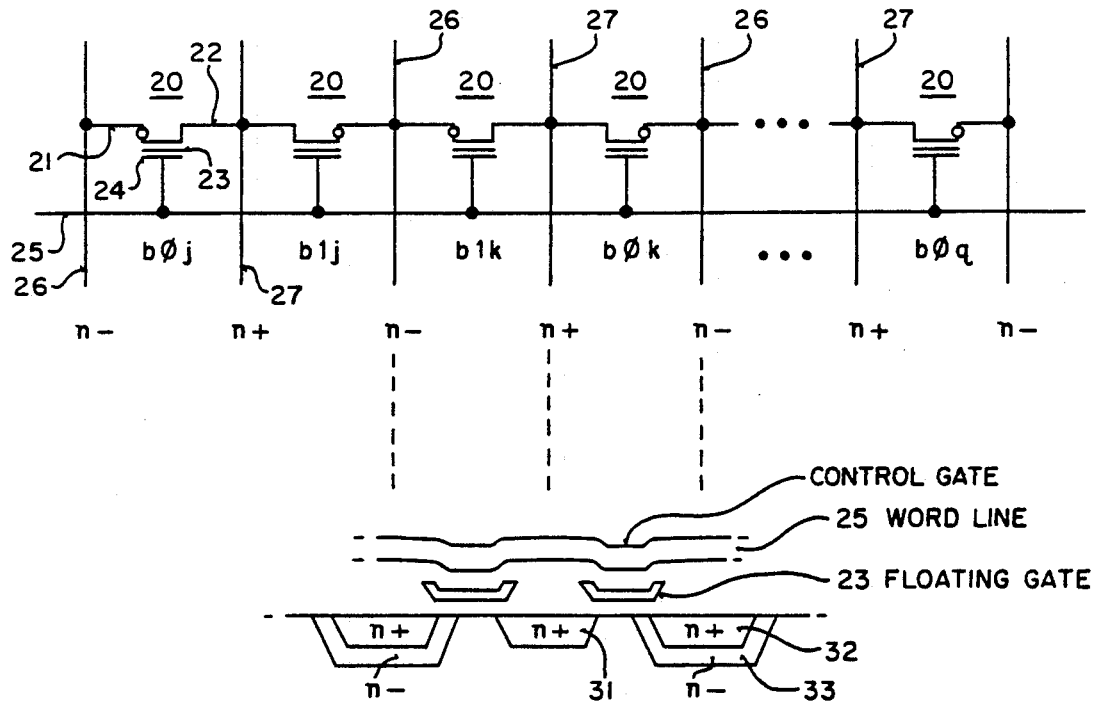
FIG_2

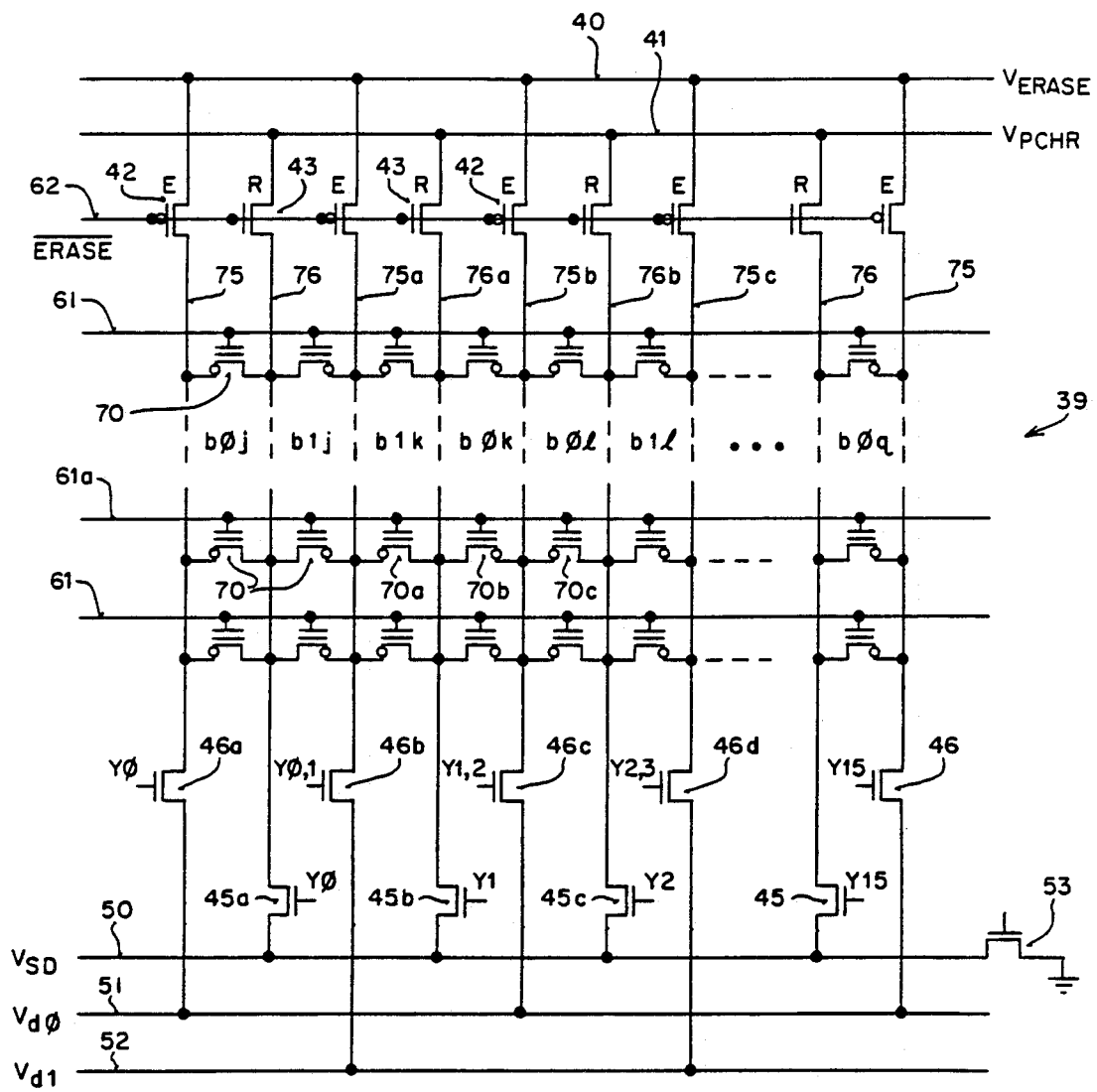
FIG_3

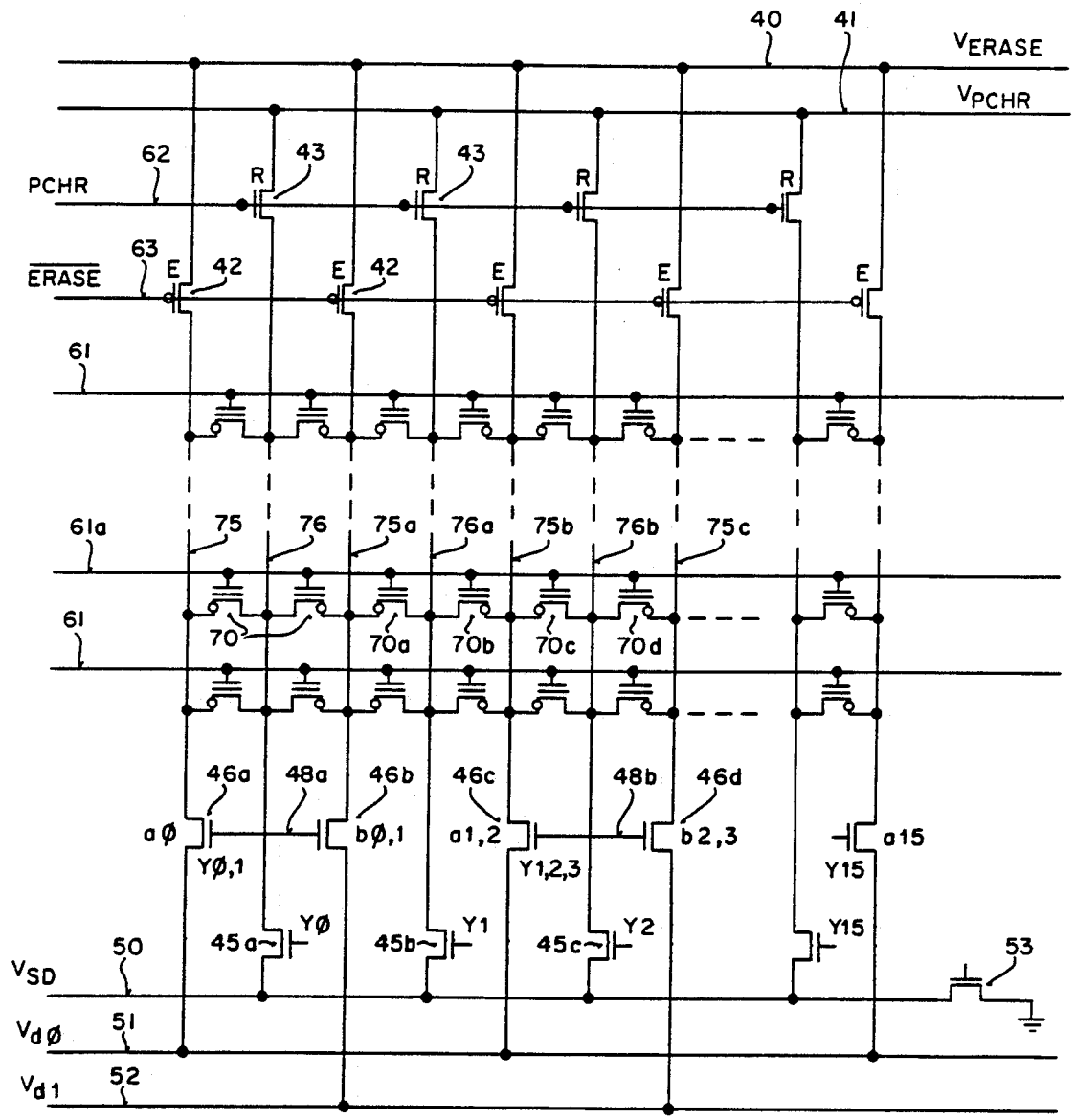
FIG_4

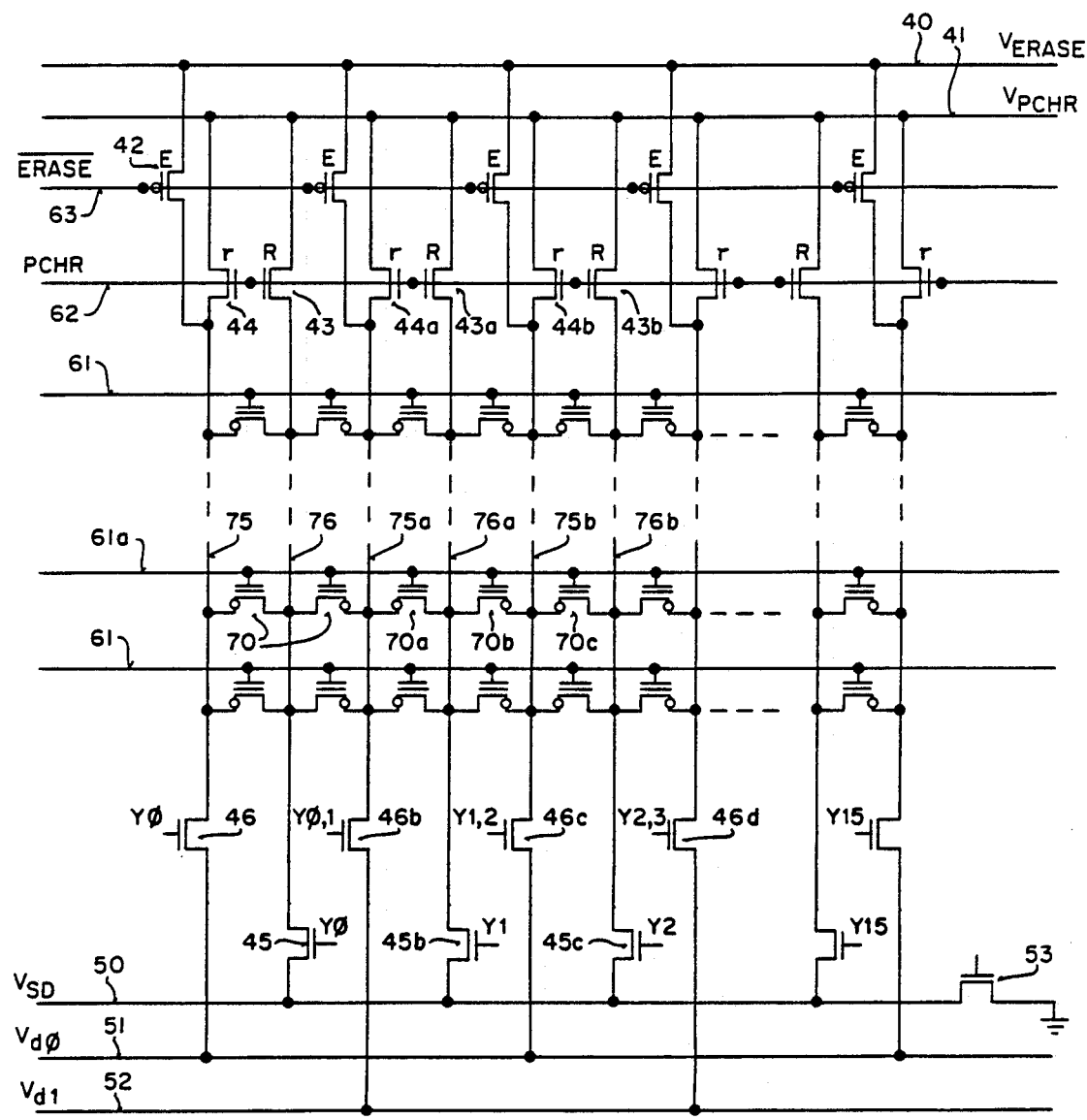
FIG_5

NOVEL ARCHITECTURE FOR VIRTUAL GROUND HIGH-DENSITY EPROMS

FIELD OF THE INVENTION

This invention relates to the field of semiconductor memory devices in more particularly to MOS read-only devices of the electrically programmable type.

BACKGROUND OF THE INVENTION

The continuing demand for higher speed and lower cost semiconductor memories has led to the development of the virtual ground configuration for read-only type memories. Virtual ground memories are a well-known technique for increasing the array density while at the same time maintaining process compatibility with existing double-level polysilicon n-channel processes. Virtual ground memories are disclosed in U.S. Pat. Nos. 3,916,169; 3,934,233; 4,021,781 and 4,387,447.

While virtual ground memories do enjoy an advantage from the perspective of increased bit density, they are not without their disadvantages. For instance, virtual ground memory arrays normally require extensive and somewhat complex decode circuitry which unfortunately occupies a very large amount of space on the chip. There also exists the problem of unwanted interaction of adjacent cells. That is, unintentional disturbance of adjacent cells may result from operations on a single bit or cell. Interaction between adjacent cells also causes parasitic currents which interfere with the reading, erasing and programming of individual cells. Ultimately, the access time and speed of the memory is adversely affected by this problem.

At least part of the reason for the adjacent cell disturbance phenomena inherently lies in the organization of prior art electrically programmable read-only memory (EPROM) arrays. Conventionally, a virtual ground EPROM array is organized as a plurality of words containing 8-bits each (8-bits forming a data byte). The array may be organized such that individual blocks only store the information from one data bit (e.g., b0) taken from a plurality of bytes, e.g., bytes 0-8. The most important characteristic of prior art arrays for purposes of this invention is that data bits within the array are read, erased and programmed individually. In other words, bits are addressed and read one bit at a time.

In an attempt to mitigate the problem of unintentional interaction of adjacent cells, an asymmetrically lightly-doped source (ALDS) cell was recently proposed in an article entitled "An Asymmetrical Lightly-Doped Source (ALDS) Cell For Virtual Ground High-Density EPROMs", by K. Yoshikawa et al. *IEDM*, 1988, pp. 432–435. The key feature of the ALDS cell is a lightly-doped n- source region which is coupled to each column in the array. As shown in FIG. 1 of the Yoshikawa paper, adjacent cells have their drains coupled to the same column line as the n- diffusion. While the authors of the above-mentioned article do report a resistance to write disturbs in virtual ground designs, ALDS virtual ground arrays still exhibit significant unwanted interaction between adjacent cells. Moreover, precharging mode for the proposed ALDS structure in virtual ground high-density EPROMs is somewhat limited.

To overcome the drawbacks associated with prior art virtual ground architectures, the present invention provides a virtual ground EPROM array in which bits from two or more data bytes are combined in a single block. According to the teachings of the present invention, a single address accesses two adjacent bits within a block (e.g., bits b0 and b1) simultaneously. The architecture of the presently invented EPROM array markedly suppresses parasitic currents and unintentional disturbance of neighboring cells.

Additionally, the present invention permits quicker access time and faster overall operating speed within the memory array. As will be seen, the present invention also supports flash erase operations.

SUMMARY OF THE INVENTION

A virtual ground electrically programmable read-only memory device is disclosed. In one embodiment the memory device comprises a plurality of memory cells formed in a semiconductor substrate and arranged in rows and columns so as to form an array. Each cell includes a control gate and first and second regions having a conductivity type different from that of the substrate. Each cell stores a single data bit. A row of cells stores bits from a plurality of data bytes according to a pattern in which pairs of adjacent cells store different bits from different bytes.

During read operations, pairs of adjacent cells are accessed simultaneously by grounding the column line shared by the cells to be read. The two adjacent column lines—one on each side of the shared column line—are coupled to separate read paths. By organizing and accessing the array in this way disturbance from/to nearby cells is virtually eliminated.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is an electrical schematic of a portion of a prior art EPROM array utilizing floating gate transistors having asymmetrical lightly-doped source regions.

FIG. 2 is an electrical diagram of a portion of the presently invented EPROM memory array. A cross-sectional view of adjacent semiconductor cells within the array is also provided.

FIG. 3 is an electrical schematic diagram of the memory array of the currently preferred embodiment of the present invention.

FIG. 4 is an electrical schematic of an alternative embodiment of the present invention.

FIG. 5 is an electrical schematic diagram of another alternative embodiment of the present invention.

DESCRIPTION OF THE PREFERRED EMBODIMENT(S)

A novel virtual ground semiconductor memory array employing floating gate memory devices is described. In the following description, numerous specific details are set forth, such as specific conductivity types, block sizes, etc., in order to provide a more thorough understanding of the present invention. It will be obvious, however, to one skilled in the art that these specific details need not be used to practice the present invention. In other instances, other well-known structures and circuits have not been shown in detail in order to avoid unnecessarily obscuring the present invention.

Referring to FIG. 1, a portion of a prior art EPROM memory block is shown. The memory array of FIG. 1 comprises a plurality of floating gate memory devices 10 each having a floating gate 14, a control gate 11 and source and drain electrodes 12 and 13, respectively. (According to practitioners in the art, during read operations electrode 12 acts as the drain of the device while electrode 13 acts as the source. During write operations the situation is reversed—with electrode 13 functioning as the drain and electrode 12 functioning as the source. To avoid confusion, this application will universally refer to electrodes 12 and 13 as the source and drain, respectively; the actual function of each for specific operations being well understood.)

As is disclosed in the prior art, floating gate transistor 10 employs an asymmetrical lightly-doped source region coupled to column line 16 within the array. A single column line 16 couples the source region 12 from a given device and the drain region 13 from an adjacent device. All of the control gates 11 within a single row are coupled together along row line 17 (also referred to as a word line).

Although such arrays may take many forms in the prior art, an important feature of the array of FIG. 1 is that adjacent cells within a block normally comprise bits of a plurality of bytes (e.g., $b_{ij}$ representing the $j^{th}$ bit of the $j^{th}$ byte). In this configuration, sensing, erasing and programming of the cells takes place on a cell-by-cell basis.

In FIG. 2 a corresponding portion of the EPROM memory array of the currently preferred embodiment is shown. The array of FIG. 2 comprises a plurality of floating gate transistors 20, each including a floating gate 23, a control gate 24, a lightly-doped n− source region 21 and an n+ drain region 22. Each of the control gates is coupled along a common row line 25. Each of the lightly-doped source regions 21 are preferably coupled together along a common n− buried bit line 26. Similarly, each of the n+ drain regions 22 are coupled together along a common n+ buried bit line 27.

Buried bit line 27 is shown cross-sectionally in FIG. 2 as comprising n+ diffusion region 31. The n− buried bit line 26 is shown cross-sectionally as comprising an n+ diffusion region 32 surrounded by lightly-doped n− region 33. The preferred process for fabricating the virtual ground cell array of FIG. 2, including the formation of n+ and n− diffusion regions 31–33, is described in U.S. Pat. No. 4,780,424; assigned to the assignee of the present application and herein incorporated by reference.

Although the detailed operation of the EPROM array of FIG. 2 will be described later, the most salient difference between the array of FIG. 2 and that of FIG. 1 is the fact that in FIG. 2 two bits of a single byte share the same n+ column. Furthermore, each n+ columns corresponds to a different byte. For example, in FIG. 2 the notation b0, j stands for bit 0 of byte j; b1, k stands for bit 1 of byte k, and so on. During read operations adjacently located data bits of the same byte are accessed simultaneously. As will be discussed in more detail later, this markedly suppresses disturbance to, or parasitic contributions from, neighboring cells.

Referring now to FIG. 3, EPROM block 39 shows an array of rows and columns of memory cells 70, each of which is an electrically programmable, insulated gate, n-channel field-effect transistor of a type well-known in the art. The control gates of each transistor 70 within a row are connected to one of a set of row lines 61. The lightly-doped source regions of each transistor are coupled to column lines 75 while the drain regions are coupled to column lines 76.

In the preferred embodiment, column lines 75 and 76 comprise buried bit lines formed of elongated, parallel, spaced-apart diffusion regions. Buried bit line 75 comprises a lightly-doped n− diffusion while line 76 comprises an n+ diffusion as shown previously in FIG. 2. The n− bit lines 75 are coupled at one end to n-channel select transistors 46 and at the other end to p-channel transistors 42.

The other terminal of device 46 is coupled to line 51, labelled $V_{d0}$. Line 51 provides a read path for one of the cells selected during a read operation. The read path for the other cell selected (recall that adjacent bits are read simultaneously) is provided by line 52, labelled $V_{d1}$. Each device 42 has one terminal coupled to an erase potential line 40, labelled $V_{ERASE}$. The control gates of devices 42 are coupled to control line 62 labelled $\overline{ERASE}$.

Common n+ bit lines 76 are connected at one end to select devices 45. The other terminal of device 45 is coupled to source/drain potential line 50, labelled $V_{SD}$. Line 50 provides the virtual ground connection to alternate column lines within array 39.

Device 43 in FIG. 3 comprises an n-channel field-effect transistor which has one terminal coupled to n+ drain line 76 and the other terminal coupled to precharging potential line 41, labelled $V_{PCHR}$. Line 41 provides a precharging potential in the range of approximately 1.5 to 2 volts to array 39 just prior to a read operation. The gates of each of the devices 43 are also coupled to line 62.

Collectively, devices 46 and 45 select the various column lines used to access pairs of memory cells within the array. The gates of each of these devices are coupled to decode circuitry (not shown) which functions to select pairs of bits to be read or programmed. By way of example, the gate of device 46c (labelled $Y_{1,2}$), is raised to select n− output line 75b. Similarly, the gate of device 45b (labelled $Y_1$) may be raised to a positive potential (e.g., 5 Volts) to connect n+ drain line 76a to line 50.

In FIG. 3, block 39 stores bits B0 and B1 of bytes j–q according to the sequence b0j, b1j, b1k, b0k, b0l, b1l ... b0q where b0j represents bit zero of byte j; b0k represents bit zero of byte k, and so on. The organization is such that a common n+ drain line 76 is shared adjacently by two different bits from the same byte. For example, cell 70a stores bit 1 from byte k while adjacent cell 70b stores bit 0 from byte k. Note that lines 76 are each associated with different bytes (e.g., line 76a is associated with bits 0 and 1 of byte k while line 76b is associated with bits 0 and 1 of byte l).

In a similar manner, adjacent cells sharing a common n− source line 75 store the same bit from different bytes. For instance, cell 70b and 70c store bit 0 of bytes k and l, respectively. It is appreciated, of course, that although the array 39 of FIG. 3 shows two bits from 8 different bytes being stored in a single block, the present invention encompasses the idea of accessing pairs of different bits within a block simultaneously. Therefore, the basic concept of the present invention may be extended in numerous ways. For instance, two 8-bit data words can be stored in a single block as follows:

b0j, b1j, b1k, b2k, b2j, b3j, b3k, . . . , b0k

Obviously, the array may also be organized to store more than two bytes per block, or to store multiple data words (16-bits) or doublewords (32-bits), without departing from the spirit or scope of the present invention.

The benefit of storing two or more bytes within a single block is a reduction in total silicon area. Since every block has certain associated boundary devices which require silicon area, larger block size generally translates into a savings in silicon area. There are, however, other considerations which are also important in determining block size. In flash virtual ground EPROMs which support block erase, for example, smaller blocks may be preferred. Considering both area and application, a reasonable block size for the embodiment of FIG. 3 is sixteen columns, i.e., two byte columns per block.

To better understand the operation of the invented array of FIG. 3 consider the following example. Assume that the user wishes to read the data stored in cells 70a and 70b within array 39. Prior to the read operation, the entire array 39 is first precharged. Precharging is a well-known technique in the art for decreasing access times by reducing the time delay normally associated with charging the column lines within the EPROM array. Precharging generally involves charging of each of the column lines 75 and 76 within the array to a predetermined voltage.

In the currently preferred embodiment, lines 41, 51 and 52 are taken to a precharge voltage of approximately 1.5 to 2.0 volts. Lines 62 (ERASE) and the gates of all devices 46 are raised to a positive potential (e.g., 5 volts) to transfer the precharge potential onto each of the lines 75 and 76 within array 39.

To access cells 70a and 70b, row line 61a is selected along with column lines 75a, 76a and 75b, as determined by a single address. Column lines 75a and 76a and 75b are selected by raising the gates of devices 46b, 45b and 46c to 5 volts (e.g., "high"). All of the other devices 45 and 46 within array 39 have their gates coupled to ground. Line 62 is also "high" so that neighboring n+ column lines such as 76b remain at the precharge potential. Lines 51 and 52 are also at the precharge potential so that output column lines 75a and 75b are charged.

Line 76a, is then discharged by raising the gate of n-channel device 53 to a "high" level. This connects line 50 to ground. Generally, device 53 is a transistor having a very large cross-sectional area—making it capable of conducting large amounts of current rapidly. Lines 51 and 52 are each coupled to read path circuitry to detect the amount of current flow through transistors 70b and 70a, respectively. Of course, the amount of current passing through cells 70a and 70b depends on the programming state of those cells. In this sense, the discharge of line 76a may be thought of as being conditional.

By way of example, if cell 70a were programmed and cell 70b were not, current would flow freely through cell 70b while little or no current would be detected flowing through 70a. The sensed current thus corresponds to the data stored in the respective cells. Note that read operations for array 39 always involves simultaneous access to adjacent cells.

It is appreciated that by maintaining lines 51 and 52 at the precharge potential during read operations, disturbance to (or from) adjacent cells is virtually eliminated. The reason for this is simply because of the neighboring or adjacent n+column lines (e.g., 76b) are at the same potential as selected n−column lines 75a and 75b. Since the potential applied to the source and drain regions of neighboring cells (e.g., 70c) is equal, no current flows through these devices.

Further, note that only one column need be grounded for a read operation involving two adjacent bits. The grounded n+column is surrounded on both sides by selected cells (e.g. 70a and 70b); therefore no parasitic currents are developed from neighboring cells during read operations. In other words, selected adjacent cells prevent propagation of the ground voltage throughout the array. This condition is referred to as mutual blocking. Mutual blocking is extremely useful because it facilitates fast read operations using relatively simple decoding circuitry. It also results in lower power consumption for the EPROM array. Perhaps most importantly, mutual blocking virtually eliminates disturbance to nearby cells.

Programming of cells 70a and 70b is accomplished by first raising line 50 to a potential of approximately 5–8 volts (in the currently preferred embodiment 6.5 volts is used). Field-effect device 46b, 46c and 45b are turned on, of couse, while all other devices 46 and 45 within the block are off. Programming potentials for cells 70a and 70b are then applied along lines 52 and 51, respectively. Row line 61a, coupled to the control gates of cells 70a and 70b, is taken to a high positive potential of approximately 12 volts.

By way of example, to program (i.e., charge) the floating gate of device 70b, line 51 is grounded. Because the drain of device 70b is at a high potential (~6.5 volts), hot carriers are generated in the channel region. Some of these hot electrons tunnel through the thin gate oxide to reside on the floating gate of the device. Device 70a may be programmed in the same way; or , if programming is not desired, a 6.5 volt potential is applied on line 52 coupled to the n−source region of 70a.

Unintentional programming of adjacent cells is avoided by proper biasing (e.g., by taking line 62 high and line 41 to a bias voltage lower than 2 volts). The n−diffusion regions of the adjacent devices (e.g., device 70c in the example above) help to prevent unintentional programming or disturbance of adjacent cells by providing a wide depletion region which acts to reduce electron acceleration. Note that high programming potentials of 6.5 volts are only applied to the n−source regions of adjacent cells and never to the n+region.

The n−diffusion regions also reduce the capacitance associated with the buried bit lines 75. This helps to increase the overall speed of the presently invented EPROM array as compared to prior art arrays.

During erasing, line 62 is taken to a low potential so that devices 42 conduct freely and devices 43 are off. Line 40 is then taken to a 12 volt potential to pull up each of the n−diffusion lines 75 to that same potential. All transistors 45 and 46 are off—which has the effect of floating all the n+column lines—and all row lines 61 are grounded. This produces a flash erase of the entire array.

Other ways of erasing the memory cells within array 39 are also possible. For example, a negative voltage may be applied to a selected word line 61 and a positive voltage applied to selected columns within the array to selectively erase individual cells.

Erasing requirements may even dictate the actual bit sequence and organization within the array. For instance, if it was desired to erase two 8-bit bytes in a single flash erase operation then the preferred bit ordering would be as follows:

$$b_{0j}, b_{1j}, b_{1k}, b_{2k}, b_{2j}, b_{3j}, b_{3k}, \ldots b_{7j}, b_{7k}, b_{0k}$$

By using this kind of alternating bit pattern in which bits 0–7 from two different bytes of two bytes are placed within a single block, only one flash erase operation need be performed to erase two bytes (multiplied by the number of rows, of course).

The various voltages applied to the n+ columns and n− columns of FIG. 3 during read, programming and erase operations are summarized in Table 1 below.

TABLE 1

|  | n+ Columns | | n− Columns | |
| --- | --- | --- | --- | --- |
|  | Selected | Unselected | Selected | Unselected |
| Read | GND | $V_{rdb}$ | Path | $V_{rbd}$/Float |
| Program | $V_{pdb}$ | $V_{rdb}$ | Path | Float/$V_{rdb}$ |
| Erase | Float | Float | $V_{erase}$ | Float | where $V_{rdb}$ = drain-source bias for read (e.g., 1–3 V)
$V_{pdb}$ = drain-source bias for programming (e.g., 5–8 V)
Path = read/write path, i.e., data path
$V_{erase}$ = erase voltage basis (e.g., 12 V)

In FIG. 4 an alternative embodiment of the present invention is shown in which the number of control lines associated with device 45 has been reduced by half. As is clearly shown, the gates of alternate pairs of devices are coupled together to a common control line. For example, devices 46a and 46b share a common gate control line 48a. This embodiment takes advantage of the fact that the states of devices 46a and 46b are always identical during read, programming and erase operations.

Also shown in FIG. 4 are separate control lines 62 and 63, labelled PCHR and $\overline{ERASE}$, respectively. Line 62 is dedicated exclusively to n− channel devices 43 while line 63 controls only p− channel devices 42. Dividing transistors 42 and 43 among separate control lines decreases the capacitance associated with each line. This allows faster switching of lines 62 and 63 and additional flexibility in control of the array. Consequently, the architecture of FIG. 4 is generally denser than that of FIG. 3 for the same fabrication process. Reading, programming and erasing of cells within the array of FIG. 4 is performed in the same manner as described above for the array of FIG. 3.

Referring to FIG. 5, yet another alternative embodiment of the present invention is shown. The circuit diagram of FIG. 5 includes additional transistors 44 coupled to output column lines 75 and to voltage precharge line 41. In this circuit configuration a precharge voltage can be applied to all of the output column lines 75 and 76 directly through line 41 leaving lines 51 and 52 dedicated to read path circuitry.

For read operations, lines 40 and 41 in FIG. 5 are both taken to the supply potential, e.g., $V_{CC}$. Line 63 is also taken to $V_{CC}$, while line 62 is taken to the source/drain bias for read operations (e.g., 1–3 volts) plus the voltage threshold, $V_{TN}$, of device 44. Unselected word lines 61 are grounded. The selected word line, (e.g., 61a) is taken to the supply potential $V_{CC}$. As before, the appropriate select transistors 46 and 45 are turned on and line 50 is grounded to access adjacent pairs of bits. For instance, to read cells 70a and 70b, devices 46b, 46c and 45b are turned on. Device 53 is turned on to ground line 50. This conditionally discharges 76a through cells 70a and 70b. Programming and erasing for the embodiment of FIG. 5 is performed as described above in connection with FIG. 3.

Thus, a novel architecture for virtual ground high-density EPROMS has been described.

We claim:

1. An electrically programmable memory device comprising:
a plurality of memory cells formed in a semiconductor substrate and arranged in rows and columns so as to form an array, each cell including a control electrode and first and second regions having a conductivity type different from that of said substrate, wherein each cell stores a data bit; a row of cells storing bits from a plurality of data bytes according to a pattern in which alternate pairs of adjacent cells within said row store two different bits of a single byte and means for accessing sid alternate pairs of adjacent cells simultaneously as determined by a single address.

2. The memory device according to claim 1 further comprising programming means for selectively programming said cells.

3. The memory device according to claim 2 further comprising erasing means for simultaneously erasing all of said cells within said array.

4. The memory device according to claim 1 wherein said pattern comprises the sequence of $$b_{0j}, b_{1j}, b_{1k}, b_{0k}, b_{0l}, b_{1l} \ldots$$

where $b_{0j}$ represents bit 0 of byte j, $b_{1k}$ represents bit 1 of byte k, etc.

5. The memory device according to claim 1 wherein said pattern comprises the sequence $$b_{0j}, b_{1j}, b_{1k}, b_{2k}, b_{2j}, b_{3j}, b_{3k} \ldots b_{nj}, b_{nk} b_{0k}$$

where $b_{nk}$ represents the $n^{th}$ bit of byte k and where $b_{nj}$ represents the $n^{th}$ bit of byte j.

6. The memory device according to claim 1 wherein said cells comprises n− channel floating gate field-effect transistors and wherein said second region includes an n+ diffusion region and said first region includes a lightly-doped n− diffusion region.

7. The memory device according to claim 6 wherein said n− and n+ diffusion regions comprise buried bit lines which form first and second column lines, respectively, wherein each of said alternate pairs share a separate one of said second column lines, said first column lines selectively functioning as output lines and said second column lines selectively functioning as ground lines during accessing of said array.

8. An electrically programmable memory device comprising:
a plurality of memory cells formed in a semiconductor substrate and arranged in rows and columns so as to form an array, each cell including a control electrode and first and second regions having a conductivity type different from that of said substrate;
a plurality of row lines, the controlled electrode of all cells in each row being coupled to the row line, each row of said cells storing bits from a plurality of data bytes;

alternate first and second column lines, the first and second regions of all cells in each column being coupled to said first and second column lines, respectively, said first column lines selectively functioning as output lines and said second column lines selectively functioning as ground lines during accessing of said array;

precharging means for precharging said first and second column lines to a positive potential;

row decoding means for selecting a row line to simultaneously access a pair of adjacent memory cells within said array;

column decoding means for coupling a second column line to ground and for coupling the pair of first column lines immediately adjacent to said second column line to separate output lines to simultaneously access said pair of said adjacent memory cells within a row by conditionally discharging said pair of first column lines through said pair of cells, said pair of cells storing two different bits of a single data byte.

9. The memory device according to claim 8 wherein each row of said array stores data bits according to the sequence $$b_{0j}, b_{1j}, b_{1k}, b_{0k}, b_{0l}, b_{1l}, \ldots$$

where $b_{0j}$ represents bit 0 of byte j, $b_{1k}$ represents bit 1 of byte k, etc.

10. The memory device according to claim 8 wherein each row of said array stores a bit pattern which includes the sequence $$b_{0j}, b_{1j}, b_{1k}, b_{2k}, b_{2j}, b_{3j}, b_{3k} \ldots b_{nj}, b_{nk}, b_{0k}$$

where $b_{nk}$ represents the $n^{th}$ bit of byte k and $b_{nj}$ represents the $n^{th}$ bit of byte j.

11. The memory device according to claim 8 wherein said output lines are coupled to said positive potential so as to prevent disturbance to other cells within said array during accessing of said pair of adjacent cells.

12. The memory device according to claim 8 wherein said cells comprise n— channel floating gate field-effect transistors and wherein said second region includes an n+ diffusion region and said first region includes a lightly-doped n— diffusion region.

13. The memory device according to claim 12 wherein said n+ and n— diffusion regions comprise buried bit lines which form said second and first column lines, respectively.

14. The memory device according to claim 13 further comprising programming means for selectively programming said cells.

15. The memory device according to claim 14 further comprising erasing means for simultaneously erasing all of said cells within said array.

16. A virtual ground electrically programmable read-only memory device comprising:

a plurality of floating gate field-effect transistors arranged in rows and columns so as to form an addressable array, each cell including a control gate, a lightly-doped n— source region, and an n+ drain region;

a plurality of row lines, the control gate of all cells in each row being coupled to a row lines, each row of said cells storing bits from a plurality of data bytes;

alternate first and second column lines, the source and drain regions of all cells in each column being coupled to said first and second column lines, respectively adjacent cells within a row either sharing said source regions or said drain regions;

means for accessing said array such that a single address accesses an adjacent pair of memory cells located within a single row simultaneously said adjacent pair of cells storing two different bits of data from a single data byte.

17. In an electrically programmable memory device, the type having an array of rows and columns of memory cells, a method of simultaneously accessing a pair of adjacent memory cells located within a row of said array, said pair of cells sharing a common column line storing two different bits of data from a single byte, said method comprising:

(a) precharging all column lines connected to said columns of cells;

(b) selecting the common column line coupled to said pair of adjacent memory cells and also selecting the two adjacent column lines located on the adjacent sides of said common column line, as determined by a single address;

(c) connecting said selected shared column line to ground;

(d) conditionally discharging said two adjacent column lines through said pair of adjacent memory cells; and (e) connecting each of said two column lines to separate outputs while leaving in the precharged state all unselected column lines.

18. The method according to claim 17 wherein said output lines are coupled to said precharging potential so as to prevent disturbance to other cells within said array during accessing of said pair of adjacent cells.

* * * * *

UNITED STATES PATENT AND TRADEMARK OFFICE
CERTIFICATE OF CORRECTION

PATENT NO. : 4,992,980
DATED : February 12, 1991
INVENTOR(S) : Park et al.

It is certified that error appears in the above-indentified patent and that said Letters Patent is hereby corrected as shown below:

Column 7, line 17, Delete "Vrbd" Insert in place thereof --Vrdb--.

Signed and Sealed this

Thirty-first Day of October 1995

Attest:

BRUCE LEHMAN

*Attesting Officer*     *Commissioner of Patents and Trademarks*